US007838936B2

(12) United States Patent
Tomiyasu et al.

(10) Patent No.: US 7,838,936 B2
(45) Date of Patent: Nov. 23, 2010

(54) SEMICONDUCTOR DEVICE AND MANUFACTURING METHOD THEREOF, AND LIQUID CRYSTAL DISPLAY DEVICE

(75) Inventors: Kazuhide Tomiyasu, Nara (JP); Yutaka Takafuji, Nara (JP); Masao Moriguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 105 days.

(21) Appl. No.: 11/884,709

(22) PCT Filed: Mar. 9, 2006

(86) PCT No.: PCT/JP2006/304616

§ 371 (c)(1),
(2), (4) Date: Aug. 20, 2007

(87) PCT Pub. No.: WO2006/126323

PCT Pub. Date: Nov. 30, 2006

(65) Prior Publication Data

US 2008/0164483 A1 Jul. 10, 2008

(30) Foreign Application Priority Data

May 23, 2005 (JP) ............................. 2005-149426

(51) Int. Cl.
*H01L 27/12* (2006.01)
(52) U.S. Cl. .................. 257/350; 257/347; 257/72; 257/E21.32; 438/459; 438/155; 438/158
(58) Field of Classification Search .............. 257/59, 257/72, 347, 354, 350, E21.087, E21.32; 438/459, 155, 158
See application file for complete search history.

(56) References Cited

U.S. PATENT DOCUMENTS

| 6,097,453 | A  | * | 8/2000  | Okita ........................... 349/43 |
| 2001/0011728 | A1 | * | 8/2001  | Gu et al. ........................ 257/72 |
| 2001/0046024 | A1 | * | 11/2001 | Hiraishi et al. ............... 349/155 |
| 2002/0047159 | A1 | * | 4/2002  | Yamazaki et al. ............ 257/347 |
| 2003/0193054 | A1 | * | 10/2003 | Hayakawa et al. ............ 257/72 |
| 2004/0061176 | A1 | * | 4/2004  | Takafuji et al. .............. 257/347 |
| 2005/0032283 | A1 | * | 2/2005  | Itoga et al. ................... 438/149 |
| 2005/0106768 | A1 |   | 5/2005  | Onozuka et al. |
| 2005/0179036 | A1 | * | 8/2005  | Yamazaki et al. .............. 257/66 |

FOREIGN PATENT DOCUMENTS

| JP | 8-264796   | 10/1996 |
| JP | 2004-165600 | 6/2004 |
| JP | 2005-099409 | 4/2005 |

OTHER PUBLICATIONS

International Search Report for PCT/JP2006/304616 mailed Apr. 25, 2006.
Bruel et al., "Smart-Cut: A New Silicon On Insulator Material Technology Based on Hydrogen Implantation and Wafer Bonding," Jpn. J. Appl. Phys. vol. 36 (1997), pp. 1636-1641.

* cited by examiner

*Primary Examiner*—Thanh V Pham
*Assistant Examiner*—Maria Ligai
(74) *Attorney, Agent, or Firm*—Nixon & Vanderhye P.C.

(57) ABSTRACT

An active matrix substrate includes a glass substrate, a driver portion formed on the glass substrate in a protruding state, a stepped portion formed along a surface of the driver portion and a surface of the glass substrate, an insulating reentrant-angle compensating film formed on a surface of the stepped portion, for compensating for at least a part of a reentrant-angle shape of the stepped portion, and a wiring layer formed along a surface of the reentrant-angle compensating film and connected to the driver portion.

9 Claims, 6 Drawing Sheets

SEMICONDUCTOR DEVICE AND MANUFACTURING METHOD THEREOF, AND LIQUID CRYSTAL DISPLAY DEVICE

This application is the U.S. national phase of International Application No. PCT/JP2006/304616, filed March 9, 2006, which designated the U.S. and claims priority to Japanese Patent Application No. 2005-149426, filed May 23, 2005, the entire contents of each of which are hereby incorporated by reference.

TECHNICAL FIELD

The invention relates to a semiconductor device and a manufacturing method thereof, and a liquid crystal display device having the semiconductor device.

BACKGROUND ART

An SOI (Silicon On Insulator) substrate, a silicon substrate having a monocrystalline silicon layer formed on the surface of an insulating layer, has been known in the art. Reduced parasitic capacitance and increased insulation resistance can be achieved by forming a device such as a transistor on an SOI substrate. In other words, higher device integration and higher device performance can be obtained. The insulating layer is formed from, e.g., a silicon oxide film ($SiO_2$).

For a higher operating speed and further reduced parasitic capacitance of a device, it is desirable that the SOI substrate have a thinner monocrystalline silicon layer. Therefore, in a known method for fabricating an SOI substrate, a silicon substrate is first bonded to another substrate such as a glass substrate and a part of the silicon substrate is then separated and removed (for example, see Non-patent reference 1).

Figure 10:
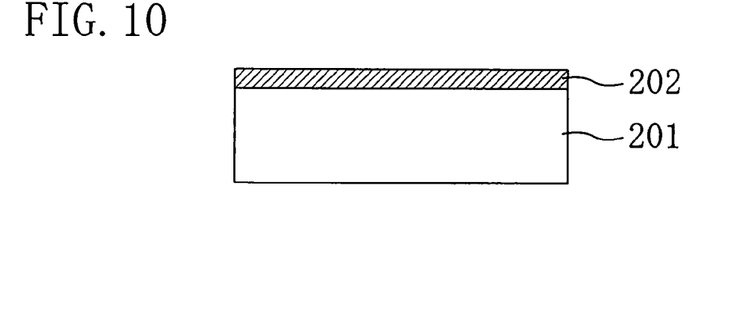
FIG. 10 shows the state in which a silicon oxide film is formed according to a conventional SOI substrate fabricating process.
Figure 11:
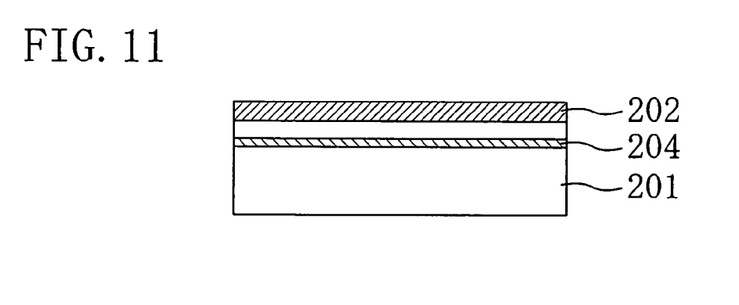
FIG. 11 shows the state in which a hydrogen implantation layer is formed according to the conventional SOI substrate fabricating process.
Figure 12:
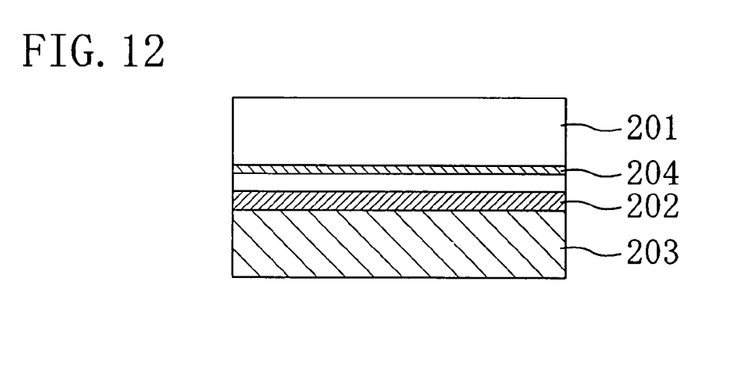
FIG. 12 shows the state in which a substrate is bonded to a glass substrate according to the conventional SOI substrate fabricating process.
Figure 13:
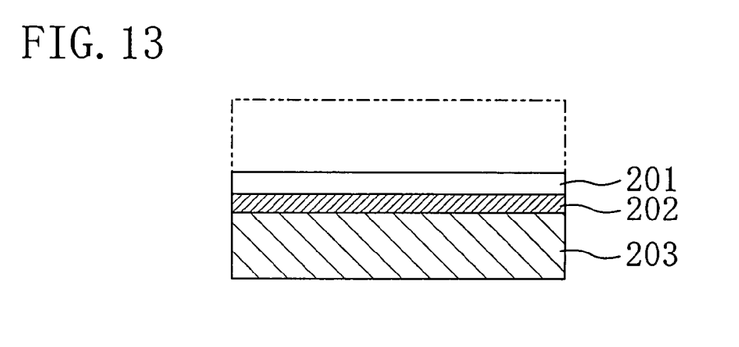
FIG. 13 shows the state in which a part of a silicon layer is separated according to the conventional SOI substrate fabricating process.

This method for fabricating an SOI substrate by bonding will be described with reference to FIGS. 10 through 13. Although the thickness of an SOI layer can be reduced by various methods such as those using mechanical polishing, chemical polishing, and porous silicon, a method using hydrogen implantation will be described herein. First, as shown in FIG. 10, a silicon oxide ($SiO_2$) layer 202, an insulating layer, is formed by oxidizing the surface of a silicon substrate 201, a first substrate. Thereafter, as shown in FIG. 11, hydrogen is implanted as a separating material into the silicon substrate 201 through the silicon oxide ($SiO_2$) layer 202 by ion implantation. A hydrogen implantation layer 204 is thus formed as a separation layer at a prescribed depth in the silicon substrate 201. The substrate surface is then cleaned by RCA cleaning or the like. As shown in FIG. 12, a second substrate, for example, a silicon substrate 203, is then bonded to the surface of the silicon oxide layer 202. The following heat treatment produces microcracks at the hydrogen ion implantation depth. As shown in FIG. 13, a part of the silicon substrate 201 is then separated along the hydrogen implantation layer 204. The thickness of the silicon substrate 201 is thus reduced, whereby a silicon layer 201 is formed. It should be noted that, after the separation, the substrate is reduced to a desired thickness by various methods such as polishing and etching, as required, and also, a process of repairing crystal defects resulting from hydrogen implantation, a process of smoothing the silicon surface, and the like are conducted by heat treatment or the like, as required.

An SOI substrate having the $SiO_2$ layer (insulating layer) 202 on the surface of the silicon substrate (second substrate) 203 and having the thin silicon layer 201 on the surface of the $SiO_2$ layer 202 is fabricated in this way.

Non-patent reference 1: Michel Bruel, "Smart-Cut: A New Silicon On Insulator Material Technology Based on Hydrogen Implantation and Wafer Bonding," Jpn. J. Appl. Phys., Vol. 36 (1997), pp. 1636-1641.

DISCLOSURE OF THE INVENTION

Problems to be Solved by the Invention

The inventors found that, by forming a hydrogen implantation layer in a semiconductor substrate and separating a part of the semiconductor substrate, a semiconductor element such as a MOS transistor formed on the semiconductor substrate can be fabricated on another substrate. Moreover, by using a transparent substrate as another substrate, a semiconductor element having a thinner semiconductor layer can be used for a liquid crystal display device.

Figure 9:
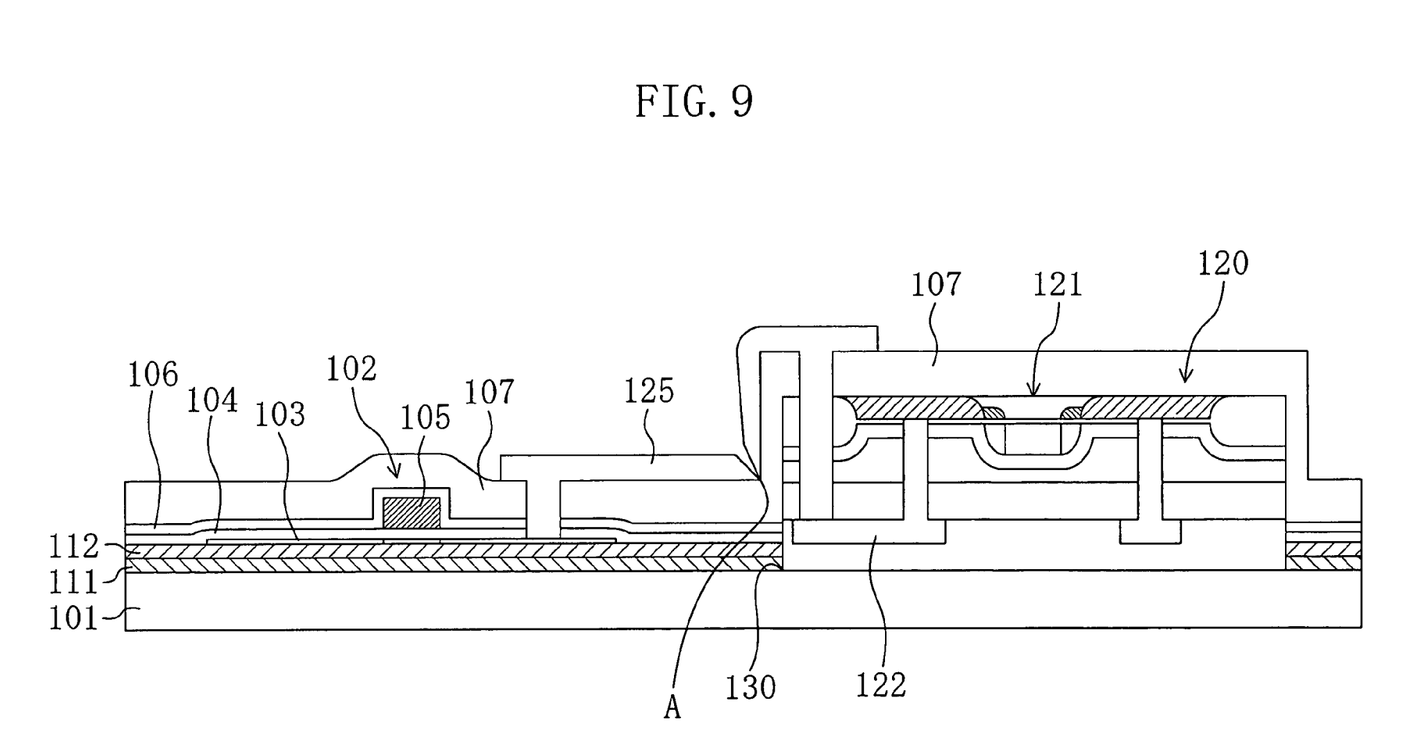
FIG. 9 is a cross-sectional view showing a disconnected wiring portion of an active matrix substrate.

It is herein assumed that a semiconductor device portion including such a semiconductor element is bonded to a glass substrate. As shown in FIG. 9, a TFT (Thin Film Transistor) 102 and a semiconductor device portion 120 to be used as a driver for driving the TFT 102 are formed on a glass substrate 101.

A first base coat layer 111 and a second base coat layer 112 are sequentially formed on the surface of the glass substrate 101. The TFT 102 is formed on the second base coat layer 112. The TFT 102 has a semiconductor layer 103 as an active region, a gate insulating film 104 covering the semiconductor layer, a gate electrode 105 formed on the gate insulating film 104, and an insulating film 106 covering the gate electrode 105.

The semiconductor device portion 120 has a MOS transistor 121, and is bonded to the surface of the glass substrate 101 which has been exposed by removing the first base coat layer 111, the second base coat layer 112, the gate insulating film 104, and the insulating film 106. The surface of the semiconductor device portion 120 and the surface of the TFT 102 are covered by a protective layer 107 that is an insulating layer.

A source electrode 122 of the MOS transistor 121 in the semiconductor device portion 120 and a source region of the semiconductor layer 103 in the TFT 102 are connected to each other by a wiring layer 125 formed from a metal or the like.

However, since the semiconductor device portion 120 is bonded to the glass substrate 101 in a protruding state, the protective layer 107 is stepped along the difference in level between the surface of the semiconductor device portion 120 and the surface of the glass substrate 101. In other words, the surface of the protective layer 107 has a stepped portion. As a result, as shown in FIG. 9, the wiring layer 125 formed on the stepped portion of the surface of the protective layer 107 may be disconnected at a reentrant angle portion A of the stepped portion.

The invention is made in view of the above problem, and it is an object of the invention to prevent disconnection of a wiring layer in a reentrant angle portion of a stepped portion in a semiconductor device having a semiconductor device portion formed on a substrate in a protruding state.

Means for Solving the Problems

In order to achieve the above object, according to the invention, a reentrant-angle compensating film is formed on a stepped portion, and a wiring layer is formed along the surface of the reentrant-angle compensating film.

More specifically, according to the invention, a semiconductor device includes: a substrate; a semiconductor device portion formed on the substrate in a protruding state and having a semiconductor element; a stepped portion formed along a surface of the semiconductor device portion and a surface of the substrate; an insulating reentrant-angle compensating film formed on a surface of the stepped portion, for compensating for at least a part of a reentrant-angle shape of the stepped portion; and a wiring layer formed along a surface of the reentrant-angle compensating film and connected to the semiconductor device portion.

Preferably, the reentrant-angle compensating film has a convex curved surface.

The reentrant-angle compensating film may be formed from a photosensitive resin.

The semiconductor element of the semiconductor device portion may have a semiconductor layer, and a part of the semiconductor layer may be separated and removed along a separation layer.

The reentrant-angle compensating film may be formed from an interlayer insulating film that covers the semiconductor device portion.

According to the invention, a method for manufacturing a semiconductor device includes the steps of: forming a semiconductor device portion having a semiconductor element, on a substrate in a protruding state; forming an insulating reentrant-angle compensating film on a stepped portion formed along a surface of the semiconductor device portion and a surface of the substrate, for compensating for at least a part of a reentrant-angle shape of the stepped portion; and forming, along a surface of the reentrant-angle compensating film, a wiring layer that is connected to the semiconductor device portion.

The semiconductor element of the semiconductor device portion may have a semiconductor layer, and the semiconductor layer may be formed by first forming a separation layer by implanting a separating material into a semiconductor substrate by ion implantation, and then separating and removing a part of the semiconductor substrate along the separation layer.

According to the invention, a liquid crystal display device includes: an active matrix substrate having a plurality of pixels arranged in a matrix; a counter substrate facing the active matrix substrate; and a liquid crystal layer formed between the active matrix substrate and the counter substrate. The active matrix substrate includes a transparent substrate, a semiconductor device portion formed on the substrate in a protruding state and having a semiconductor element, a stepped portion formed along a surface of the semiconductor device portion and a surface of the substrate, an insulating reentrant-angle compensating film formed on a surface of the stepped portion, for compensating for at least a part of a reentrant-angle shape of the stepped portion, and a wiring layer formed along a surface of the reentrant-angle compensating film and connected to the semiconductor device portion.

Preferably, the active matrix substrate includes a switching element and a pixel electrode for each of the plurality of pixels, and each pixel electrode is connected to a corresponding switching element. Preferably, the reentrant-angle compensating film covers the switching element, and the wiring layer and the pixel electrode are formed on the surface of the reentrant-angle compensating film and are formed from a same material.

(Effects)

Hereinafter, effects of the invention will be described.

Since a semiconductor device portion is provided on a substrate in a protruding state, a stepped portion is formed along the surface of the semiconductor device portion and the surface of the substrate in a semiconductor device. An insulating reentrant-angle compensating film is formed on the stepped portion in order to compensate for at least a part of a reentrant-angle shape of the stepped portion. Therefore, a wiring layer connected to the semiconductor device portion is not formed along the reentrant-angle shape of the stepped portion, but is formed along the surface of the reentrant-angle compensating film that compensates for the reentrant-angle shape. As a result, disconnection in the reentrant-angle portion of the stepped portion is prevented.

The reentrant-angle compensating film may have a flat surface or a concave curved surface. However, by forming a reentrant-angle compensating film having a convex curved surface, disconnection can be more reliably prevented. Moreover, by forming the reentrant-angle compensating film from a photosensitive resin, the reentrant-angle compensating film can be easily and accurately patterned by photolithography.

The semiconductor layer of the semiconductor device portion can be formed by first forming a separation layer by implanting a separating material into a semiconductor substrate by ion implantation, and then separating and removing a part of the semiconductor substrate along the separation layer. As a result, the thickness of the semiconductor layer is reduced, whereby a higher operation speed and further reduced parasitic capacitance of the semiconductor device portion can be achieved.

When the semiconductor device is used for an active matrix substrate of a liquid crystal display device, a reentrant-angle compensating film can be formed so as to cover a switching element of the active matrix substrate, and a wiring layer and a pixel electrode can be formed from the same material on the surface of the reentrant-angle compensating film. In this case, the wiring layer and the pixel electrode can be formed by the same step, whereby manufacturing cost can be reduced.

Effects of the Invention

According to the invention, a reentrant-angle compensating film is formed on a stepped portion, and a wiring layer is formed along the surface of the reentrant-angle compensating film. Therefore, disconnection of the wiring layer in a reentrant-angle portion of the stepped portion can be prevented.

DESCRIPTION OF THE REFERENCE NUMERALS

S: liquid crystal display device
1: semiconductor layer, semiconductor substrate
17: separation layer
22: glass substrate (substrate)
30: TFT (switching element)
37: wiring layer
42: active matrix substrate (semiconductor device)
43: counter substrate
44: liquid crystal layer
50: driver portion (semiconductor device portion)
51: MOS transistor (semiconductor element)
53: stepped portion
54: reentrant-angle compensating film
63: pixel electrode

BEST MODE FOR CARRYING OUT THE INVENTION

Hereinafter, embodiments of the invention will be described in detail with reference to the accompanying drawings. It should be noted that the invention is not limited to the following embodiments.

First Embodiment

Figure 1:
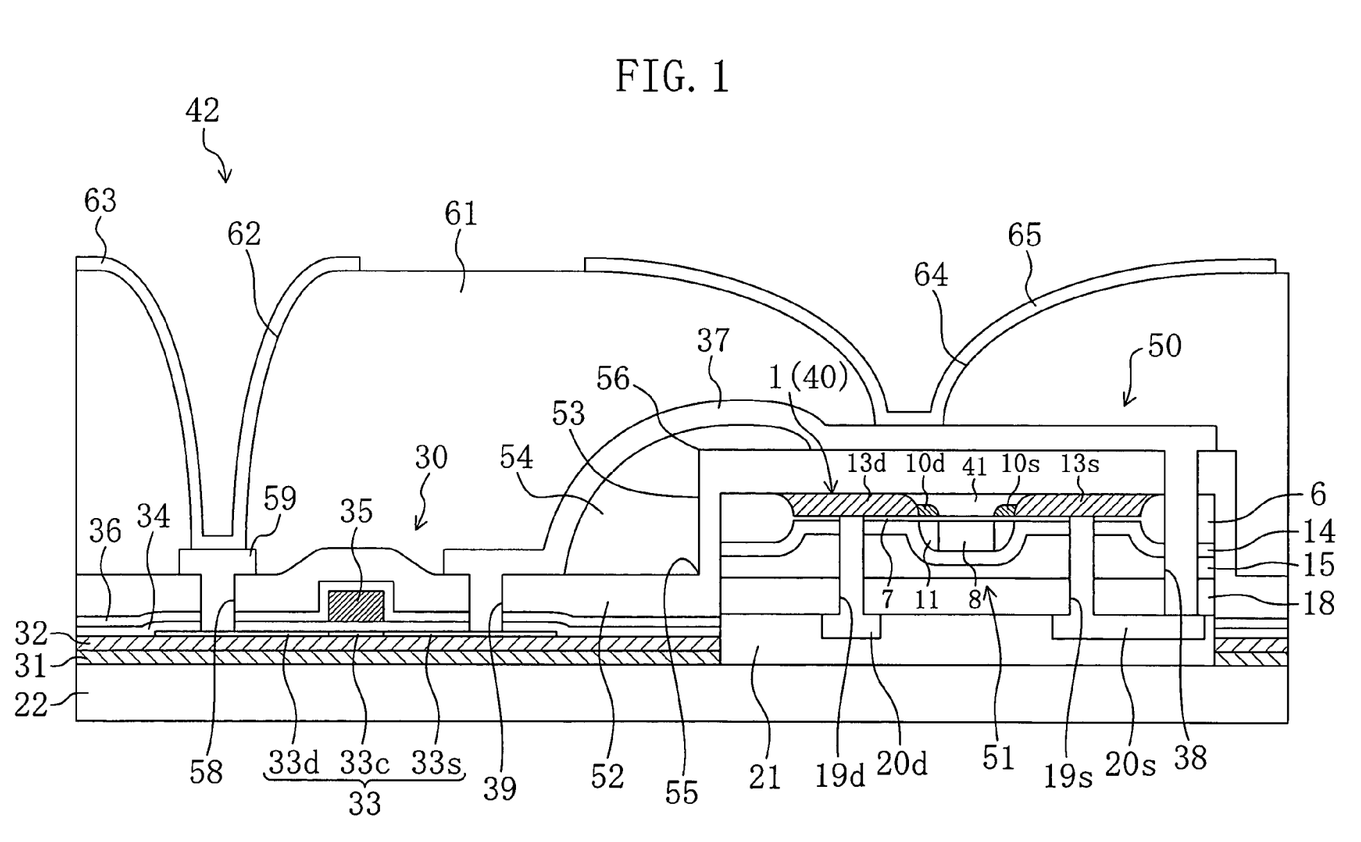
FIG. 1 is an enlarged cross-sectional view of an active matrix substrate of a first embodiment.
Figure 5:
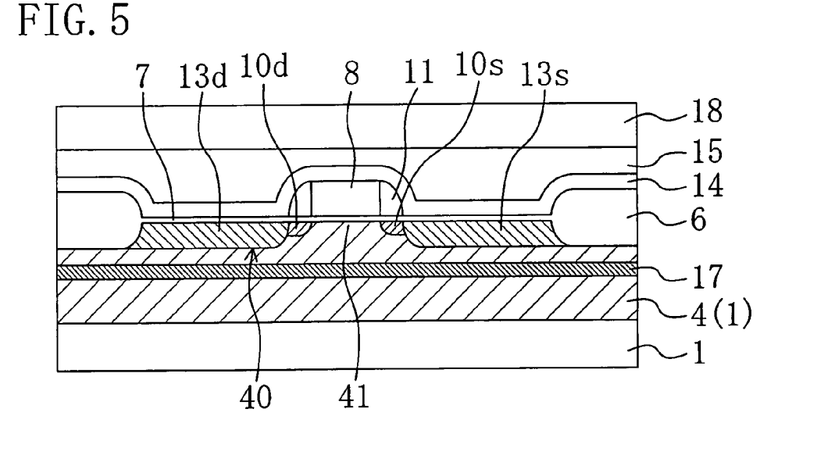
FIG. 5 is a cross-sectional view showing a separation layer formed in the step of forming a separation layer.
Figure 6:
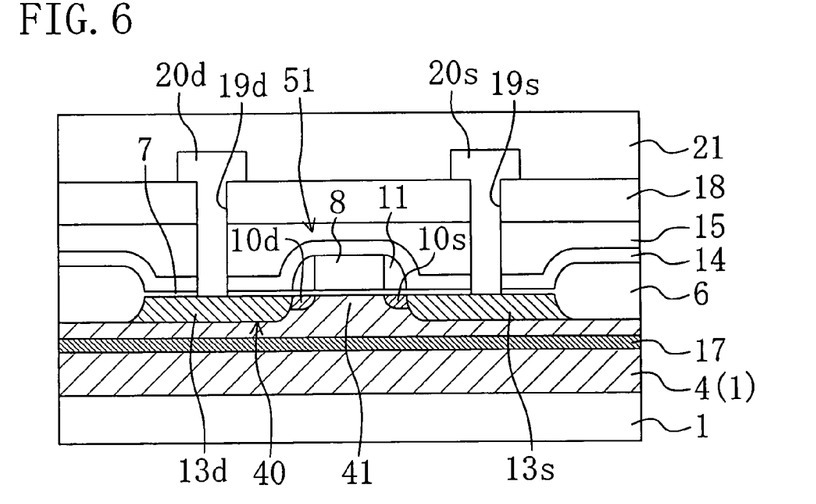
FIG. 6 is a cross-sectional view showing a planarizing film and electrodes which are formed in the step of forming a planarizing film.
Figure 7:
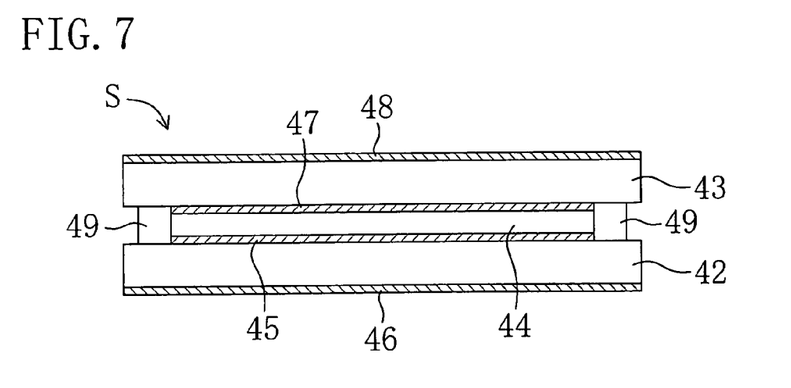
FIG. 7 is a schematic cross-sectional view of a main part of a liquid crystal display device.

FIGS. 1 through 7 show a first embodiment of the invention. FIG. 7 is a schematic cross-sectional view of a main part of a liquid crystal display device (LCD) S. FIG. 1 is an enlarged cross-sectional view of a main part of an active matrix substrate 42. FIGS. 1 through 6 are cross-sectional views illustrating a method for manufacturing an active matrix substrate 42, a semiconductor device, and a driver portion 50, a semiconductor device portion.

As shown in FIG. 7, the LCD S includes an active matrix substrate 42, a counter substrate 43 facing the active matrix substrate 42, and a liquid crystal layer 44 formed between the substrates 42, 43.

A plurality of pixels (not shown) are formed on the active matrix substrate 42, and a TFT (Thin Film Transistor) 30 as shown in FIG. 1 is formed at each pixel as a switching element. An alignment film 45 is formed on a surface of the active matrix substrate 42 which faces the liquid crystal layer 44. A polarizing plate 46 is formed on the opposite surface of the active matrix substrate 42, the surface which does not face the liquid crystal layer 44. A driver portion 50 for driving the TFTs 30 is mounted on the active matrix substrate 42.

Although not shown in the figures, elements such as a color filter and a common electrode made from ITO are formed on the counter substrate 43. An alignment film 47 is formed on a surface of the counter substrate 43 which faces the liquid crystal layer 44. A polarizing plate 48 is formed on the opposite surface of the counter substrate 43, the surface which does not face the liquid crystal layer 44. The liquid crystal layer 44 is sealed by a seal member 49 interposed between the active matrix substrate 42 and the counter substrate 43. The LCD S provides desired display by controlling an orientation state of liquid crystal molecules in the liquid crystal layer 44 by the TFTs 30 on a pixel-by-pixel basis.

As shown in FIG. 1, the TFTs 30 are formed on the surface of a glass substrate 22, a transparent substrate, with a first base coat layer 31 and a second base coat layer 32 interposed therebetween. The first base coat layer 31 is formed from, e.g., a SiN layer, and is formed on the surface of the glass substrate 22. The second base coat layer 32 is formed from, e.g., a TEOS layer, and is formed on the surface of the first base coat layer 31.

The TFT 30 includes: a semiconductor layer 33 including an active region; a gate insulating film 34 covering the semiconductor layer 33; a gate electrode 35 formed on the gate insulating film 34; and a protective film 36 covering the gate electrode 35. The semiconductor layer 33 has a source region 33s, a drain region 33d, and a channel region 33c formed between the source region 33s and the drain region 33d.

As shown in FIG. 1, the driver portion 50 is provided on the surface of the glass substrate 22 in a protruding state and has a MOS transistor 51 as a semiconductor element. An insulating film 21 as a first planarizing film, an interlayer insulating film 18 as a second planarizing film, an interlayer insulating film 15, and an insulating film 14 are sequentially formed on the glass substrate 22 in this order.

A gate oxide film 7 and a LOCOS oxide film 6 are formed on the insulating film 14. A gate electrode 8 and a sidewall 11 are formed between the gate oxide film 7 and the insulating film 14. The sidewall 11 is formed on both sides of the gate electrode 8.

In the insulating film 21, a source electrode 20s and a drain electrode 20d are formed at the interface with the interlayer insulating film 18. Contact holes 19s, 19d are formed so as to extend through the interlayer insulating film 18, the interlayer insulating film 15, the insulating film 14, and the gate oxide film 7. The contact holes 19s, 19d are filled with an electrically conductive material. The electrically conductive material in the contact hole 19s is formed integral with the source electrode 20s, and the electrically conductive material in the contact hole 19d is formed integral with the drain electrode 20d.

A semiconductor layer 1 is formed on the surface of the gate oxide film 7. The semiconductor layer 1 is a monocrystalline silicon layer. The semiconductor layer 1 is separated from an adjacent semiconductor layer (not shown) by the LOCOS oxide film 6, and is covered by a protective film 52 which is an insulating film. The protective film 52 covers the side surface of the driver portion 50 and also covers the TFT 30. The protective film 52 therefore has a stepped portion 53 along the surface of the driver portion 50 and the surface of the glass substrate 22.

As described later, the semiconductor layer 1 is formed as follows: a separation layer is formed by implanting a separating material into a semiconductor substrate by ion implantation, and a part of the semiconductor substrate is separated and removed along the separation layer. The semiconductor layer 1 is separated on the side of the protective film 52. At least one of hydrogen and an inert gas element can be used as a separating material.

An active region 40 is formed in the semiconductor layer 1. The active region 40 has a channel region 41, low concentration impurity regions 10s, 10d formed on both sides of the channel region 41, and high concentration impurity regions 13s, 13d formed on both sides of the low concentration impurity regions 10s, 10d. N-type impurities such as phosphorus are implanted into the low concentration impurity regions 10s, 10d and the high concentration impurity regions 13s, 13d. The low concentration impurity regions 10s, 10d form a so-called LDD region. The high concentration impurity region 13s forms a source region, and the high concentration impurity region 13d forms a drain region.

The channel region 41 faces the gate electrode 8 with the gate oxide film 7 interposed therebetween. The low concentration impurity regions 10s, 10d face the sidewall 11 with the gate oxide film 7 interposed therebetween. The source electrode 20s is connected to the high concentration impurity region 13s through the contact hole 19s, and the drain electrode 20d is connected to the high concentration impurity region 13d through the contact hole 19d.

The driver portion 50 and the TFT 30 are connected to each other through a wiring layer 37. More specifically, in the driver portion 50, a contact hole 38 is formed on the source electrode 20s so as to extend through the interlayer insulating film 18, the interlayer insulating film 15, the insulating film 14, the LOCOS oxide film 6, and the protective film 52. In the TFT 30, a contact hole 39 is formed on the source region 33s so as to extend through the gate insulating film 34 and the protective films 36, 52. The contact holes 38, 39 are filled with an electrically conductive material.

The invention is characterized in that, as shown in FIG. 1, an insulating reentrant-angle compensating film 54 is formed on the surface of the stepped portion 53 in order to compensate for at least a part of a reentrant-angle shape of the stepped portion 53. To "compensate for a reentrant-angle shape of the stepped portion 53" herein means to reduce the recess of the stepped portion 53 by covering a reentrant-angle portion 55 with the reentrant-angle compensating film 54. In this embodiment, the reentrant-angle compensating film 54 covers both the reentrant-angle portion 55 and a salient-angle portion 56 of the stepped portion 53. It should be noted that the invention is not limited to this, and the reentrant-angle compensating film 54 need only be formed so as to eliminate the reentrant-angle shape by covering at least the reentrant-angle portion 55.

The reentrant-angle compensating film 54 is formed from a photosensitive resin. The reentrant-angle compensating film 54 has a convex curved surface. The wiring layer 37 is formed along the surface of the reentrant-angle compensating film 54. The reentrant-angle portion 55 of the stepped portion 53 is thus covered by the reentrant-angle compensating film 54 and does not appear at the surface of the reentrant-angle compensating film 54 on which the wiring layer 37 is formed.

It should be noted that, instead of having a convex curved surface, the reentrant-angle compensating film 54 may have an inclined surface or a gentle concave curved surface. In this case as well, disconnection of the wiring layer 37 can be prevented.

A contact hole 58 extending through the gate insulating film 34 and the protective films 36, 52 is formed on the drain region 33d of the TFT 30. A drain electrode 59 is formed on the protective film 52, and the drain region 33d is connected to the drain electrode 59 through the contact hole 58.

An interlayer insulating film 61 is formed on the protective film 52 so as to cover the wiring layer 37. In the interlayer insulating film 61, a contact hole 62 is formed on the drain electrode 59 so that the drain electrode 59 is exposed. A pixel electrode 63 is formed on the surface of the interlayer insulating film 61 and is connected to the drain electrode 59 through the contact hole 62. The pixel electrode 63 is thus provided for each pixel and is connected to a corresponding TFT 30.

In the interlayer insulating film 61, a contact hole 64 is formed on the driver portion 50 so that the wiring layer 37 is exposed. A wiring portion 65 is formed on the surface of the interlayer insulating film 61 and is connected to the wiring layer 37 through the contact hole 64. Although not shown in the figures, an alignment film is formed on the interlayer insulating film 61.

(Manufacturing Method)

Hereinafter, a method for manufacturing the driver portion 50 and the active matrix substrate 42 will be described. The method for manufacturing the active matrix substrate 42 includes the steps of: forming a device portion, i.e., manufacturing the driver portion 50; forming a reentrant-angle compensating film; and forming a wiring layer.

First, a SiN layer 31 and a TEOS layer 32 are sequentially formed on a glass substrate 22 in this order as base coat layers. A TFT 30 is then formed on the TEOS layer 32 as follows: first, a semiconductor layer 33 is patterned on the surface of the TEOS layer 32 by photolithography. A gate insulating film 34 is then formed on the TEOS layer 32 so as to cover the semiconductor layer 33. Thereafter, a gate electrode 35 is patterned by photolithography so as to extend on a part of the semiconductor layer 33. An impurity element is implanted into the semiconductor layer 33 by ion implantation by using the gate electrode 35 as a mask. The gate electrode 35 is then covered by a protective film 36. The TFT 30 is thus formed on the glass substrate 22.

Thereafter, an etching step is conducted to expose a region of the glass substrate 22 to which the driver portion 50 is to be bonded. Thereafter, the step of forming a device portion, that is, the step of forming the driver portion 50 on the exposed glass substrate 22 in a protruding state, is conducted.

The step of forming a device portion includes the steps of: forming an oxide film; forming a gate electrode; forming an active region; forming a separation layer; forming a planarizing film; bonding; separating; and forming a protective film.

In the step of forming an oxide film, a P-well region 4 is formed and a LOCOS oxide film 6 and a gate oxide film 7 are formed on a semiconductor substrate 1, a silicon substrate (this semiconductor substrate 1 corresponds to the semiconductor layer 1 before a part of the semiconductor substrate 1 is separated).

Figure 2:
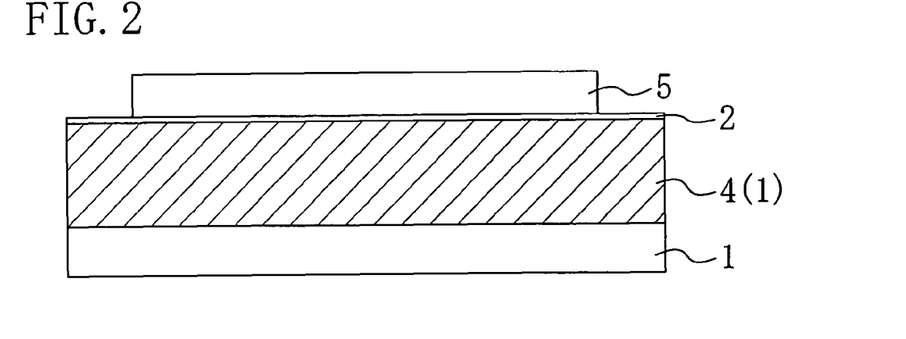
FIG. 2 is a cross-sectional view showing a silicon nitride film formed in the step of forming an oxide film.

More specifically, as shown in FIG. 2, a thermal oxide film 2 is formed on the semiconductor substrate 1, and a P-type impurity element (e.g., boron) is implanted into the semiconductor substrate 1 by ion implantation. Thereafter, the semiconductor substrate 1 is heat-treated so that the implanted P-type impurity element is diffused and activated. The P-well region 4 is thus formed.

Figure 3:
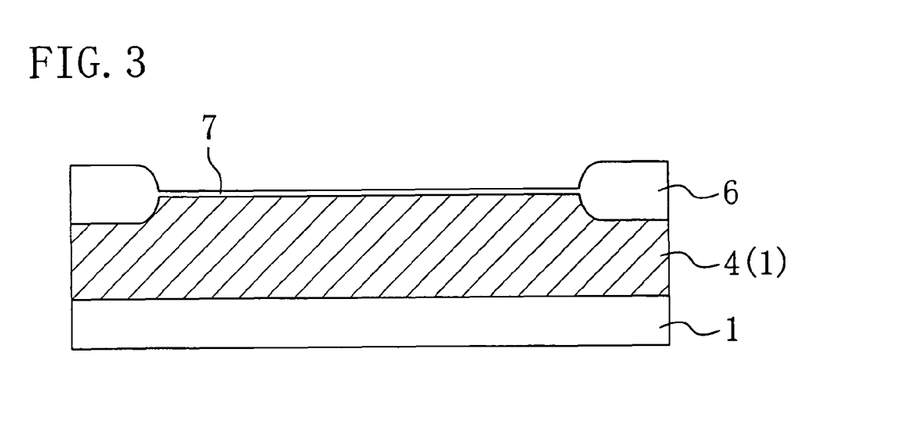
FIG. 3 is a cross-sectional view showing a gate oxide film formed in the step of forming an oxide film.

A silicon nitride film 5 is then patterned on the surface of the thermal oxide film 2. The thermal oxide film 2 and the semiconductor substrate 1 are then subjected to LOCOS oxidation. As a result, a LOCOS oxide film 6 is formed on both sides of the silicon nitride film 5. Thereafter, as shown in FIG. 3, the silicon nitride film 5 and the thermal oxide film 2 are removed, and a gate oxide film 7 is formed in the region where the thermal oxide film 2 used to be.

In the step of forming a gate electrode, an electrically conductive material is formed on the surface of the gate oxide film 7 and is patterned by photolithography or the like. A gate electrode 8 is thus formed on the semiconductor substrate 1 (see FIG. 4).

Figure 4:
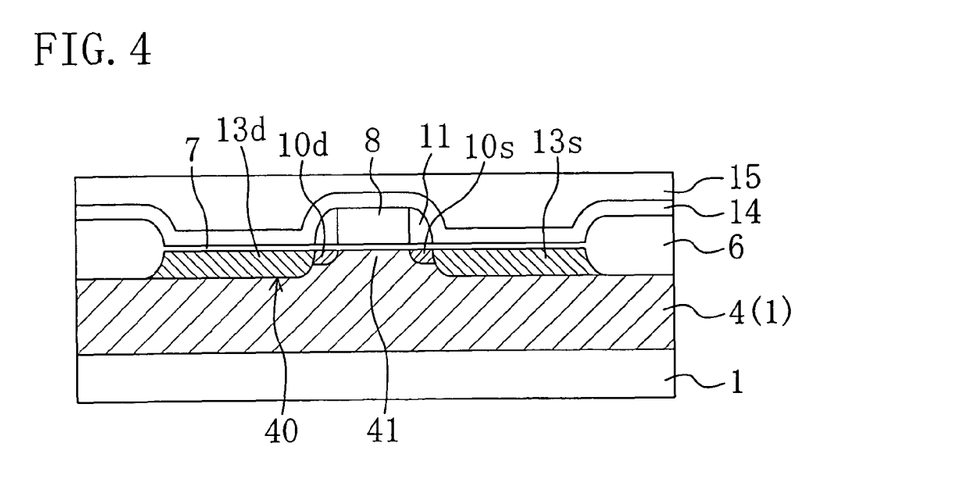
FIG. 4 is a cross-sectional view showing an interlayer insulating film formed in the step of forming a separation layer.

In the step of forming an active region, as shown in FIG. 4, an active region 40 is formed in the P-well region 4 of the semiconductor substrate 1. More specifically, N-type low concentration impurity regions 10s, 10d are first formed by implanting an N-type impurity element such as phosphorus by ion implantation by using the gate electrode 8 as a mask. A $SiO_2$ film is then formed on the surface of the gate oxide film 7 by CVD or the like. The $SiO_2$ film is then etched by anisotropic dry etching, whereby a sidewall 11 is formed on both side walls of the gate electrode 8.

Thereafter, N-type high concentration impurity regions 13s, 13d are formed by implanting an N-type impurity element such as phosphorus by ion implantation by using the gate electrode 8 and the sidewall 11 as a mask. As a result, the low concentration impurity regions 10s, 10d are formed in a region that faces the sidewall 11 with the gate oxide film 7 interposed therebetween. Thereafter, an insulating film 14 such as $SiO_2$ is formed, and the low concentration impurity regions 10s, 10d and the high concentration impurity regions 13s, 13d are heat-treated in order to activate the implanted impurity element.

In the step of forming a separation layer, as shown in FIG. 4, an interlayer insulating film 15 is formed on the surface of the insulating film 14. A separating material formed from an inert gas element such as hydrogen, He, and Ne is implanted into the P-well region of the semiconductor substrate 1 through the interlayer insulating film 15 by ion implantation. As shown in FIG. 5, a separation layer 17 containing the separating material is thus formed in the semiconductor substrate 1.

In the step of forming a planarizing film, as shown in FIG. 5, a $SiO_2$ film is formed so as to cover the semiconductor substrate 1 and the interlayer insulating film 15, and then planarized by CMP (Chemical Mechanical Polishing) or the like. An interlayer insulating film 18 is thus formed.

A source electrode 20s and a drain electrode 20d are then formed. More specifically, as shown in FIG. 6, contact holes 19s, 19d are first formed so as to extend through the interlayer insulating film 18, the interlayer insulating film 15, the insulating film 14, and the gate oxide film 7. The contact hole 19s is formed on the high concentration impurity region (source region) 13s, and the contact hole 19d is formed on the high concentration impurity region (drain region) 13d. An electrically conductive material is provided in the contact holes 19s, 19d and on the surface of the interlayer insulating film 18. By patterning the electrically conductive material, the source electrode 20s is formed on the contact hole 19s and the drain electrode 20d is formed on the contact hole 19d. Thereafter, an insulating film 21 is formed, and the surface of the insulating film 21 is palanarized by CMP or the like.

In the bonding step, as shown in FIG. 1, the planarized surface of the insulating film 21 is cleaned and then bonded to the surface of the glass substrate 22 which has been exposed by the second etching step.

In the following separating step, heat treatment is conducted at about 400° C. to about 600° C. As a result, as shown in FIG. 1, a part of the semiconductor substrate 1 including the P-well region 4 is separated along the separation layer 17, whereby moving of a MOS transistor 51 of the driver portion 50 onto the glass substrate 22 is completed. Note that, in this embodiment, the semiconductor substrate 1 which has been partially separated in the separating step is referred to as a semiconductor layer 1.

In the step of forming a protective film, after the separation layer 17 is removed by etching or the like, the semiconductor layer 1 is further etched in order to thin the channel region 41 and to expose the LOCOS oxide film 6 for element separation. A protective film 52 is then formed in order to protect the exposed surface of the semiconductor layer 1 and the side surface of the driver portion 50 and to ensure electric insulation.

The step of forming a device portion is thus completed.

In the step of forming a reentrant-angle compensating film, a reentrant-angle compensating film 54 is formed on the stepped portion 53. More specifically, an insulating film of a photosensitive resin is uniformly formed on the surface of the protective film 52 so as to cover the driver portion 50. The insulating film is then patterned by, e.g., photolithography into the reentrant-angle compensating film 54 that covers the reentrant-angle portion 55 of the stepped portion 53. In this embodiment, as shown in FIG. 1, the reentrant-angle compensating film 54 covers a part of the reentrant-angle portion 55 of the stepped portion 53. However, the invention is not limited to this, and the reentrant-angle compensating film 54 may cover the entire reentrant-angle portion 55 of the stepped portion 53 along the periphery of the driver portion 50. In this case, the reentrant-angle compensating film 54 is formed so as to have a convex curved surface.

Thereafter, in the step of forming a wiring layer, a wiring layer 37 is formed along the surface of the reentrant-angle compensating film 54. First, in the driver portion 50, a contact hole 38 is formed on the source electrode 20s so as to extend through the interlayer insulating film 18, the interlayer insulating film 15, the insulating film 14, the LOCOS oxide film 6, and the protective film 52. A contact hole 39 is also formed on the source region 33c of the TFT 30 so as to extend through the gate insulating film 34 and the protective films 36, 52. The contact holes 38, 39 are then filled with an electrically conductive material, and an electrically conductive film is evenly formed on the surface of the protective film 52 and the surface of the reentrant-angle compensating film 54. Thereafter, the electrically conductive film is patterned into a wiring layer 37 that connects the source electrode 20s of the driver portion 50 and the source region 33s of the TFT 30 to each other.

In the step of forming a wiring layer, it is preferable to form the drain electrode 59 simultaneously with the wiring layer 37. More specifically, a contact hole 58 is formed on the drain region 33d of the TFT 30 so as to extend through the gate insulating film 34 and the protective film 36. The contact hole 58 is then filled with an electrically conductive material that forms the wiring layer 37, and the electrically conductive film is formed on the surface of the protective film 52. The drain electrode 59 is formed simultaneously with the wiring layer 37 by patterning this electrically conductive film.

Thereafter, the step of forming a pixel electrode is conducted. First, an interlayer insulating film 61 of a photosensitive resin is evenly formed on the protective film 52 so as to cover the TFT 30 and the driver portion 50. Then, in the interlayer insulating film 61, a contact hole 62 is formed on the drain electrode 59 and a contact hole 64 is formed on the wiring layer 37 on the driver portion 50. An electrically conductive film such as ITO is then formed on the interlayer insulating film 61 and in the contact holes 62, 64 and is patterned into a prescribed shape by photolithography or the like. As a result, a pixel electrode 63 connected to the drain electrode 59 and a wiring portion 65 connected to the wiring layer 37 are formed.

The active matrix substrate 42 is manufactured by these steps. The active matrix substrate 42 is bonded to a counter substrate 43, and a liquid crystal layer 44 is formed between the active matrix substrate 42 and the counter substrate 43. An LCD S is thus manufactured.

Effects of the First Embodiment

When the driver portion 50 is formed by separating and removing a part of the semiconductor layer 1 along a separation layer and is formed on the glass substrate 22 in a protruding state, the stepped portion 53 is formed along the surface of the driver portion 50 and the surface of the glass substrate 22. According to this embodiment, even when such a stepped portion 53 is formed, the reentrant-angle portion 55 of the stepped portion 53 is covered by the reentrant-angle compensating film 54. Therefore, the wiring layer 37 that connects the driver portion 50 and the TFT 30 to each other can be formed along the surface of the reentrant-angle compensating film 54. In other words, if the wiring layer 37 is formed on the reentrant-angle portion 55 of the stepped portion 53, disconnection of the wiring layer 37 is likely to occur. In this embodiment, however, since the wiring layer 37 can be formed on the surface of the reentrant-angle compensating film 54 that compensates for the reentrant-angle shape, disconnection of the wiring layer 37 can be prevented. Especially, since the reentrant-angle compensating film 54 has a convex curved surface, disconnection of the wiring layer 37 can be more reliably prevented. Moreover, since the reentrant-angle compensating film 54 is formed from a photosensitive resin, the reentrant-angle compensating film 54 can be easily and accurately patterned by photolithography.

Second Embodiment

Figure 8:
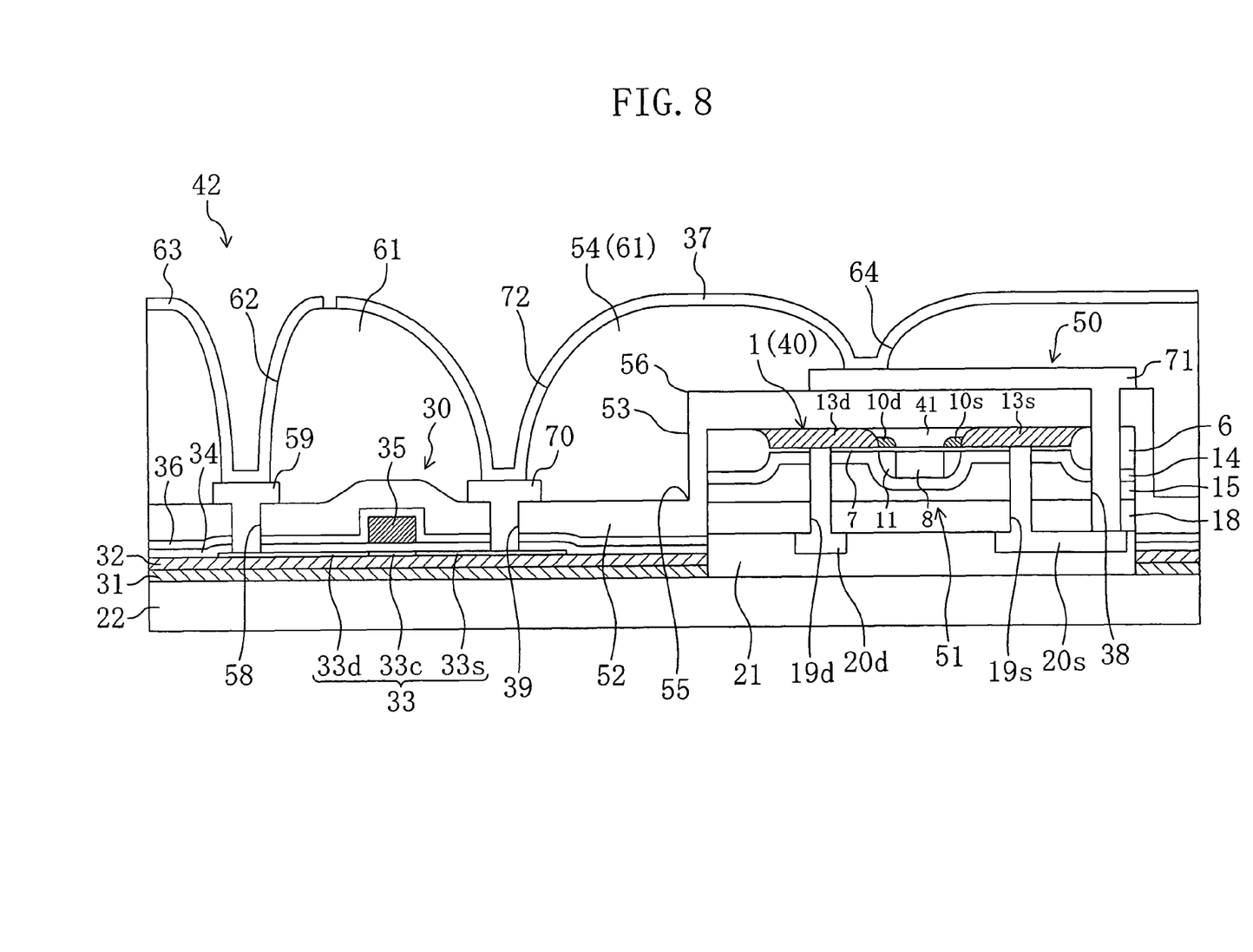
FIG. 8 is an enlarged cross-sectional view of an active matrix substrate of a second embodiment.

FIG. 8 shows a second embodiment of the invention. It should be noted that, in this embodiment, the same parts as those in FIGS. 1 through 7 are denoted with the same reference numerals and characters, and detailed description thereof will be omitted.

This embodiment is characterized in that a reentrant-angle compensating film 54 is formed from an interlayer insulating film 61. A source electrode 70 is formed in the protective film 52 on the source region 33s of the TFT 30. The source electrode 70 is connected to the source region 33s through the contact hole 39. In the interlayer insulating film 61, a contact hole 72 is formed on the source electrode 70.

A wiring portion 71 is formed on the protective film 52 on the driver portion 50. The wiring portion 71 is connected to the source electrode 20s of the driver portion 50 through the contact hole 38. In the interlayer insulating film 61, a contact hole 64 is formed on the wiring portion 71.

A pixel electrode 63 and a wiring layer 37 are formed on the surface of the interlayer insulating film 61. The wiring layer 37 is connected to the source electrode 70 of the TFT 30 through the contact hole 72 and is also connected to the wiring portion 71 of the driver portion 50 through the contact hole 64. The source electrode 20s of the driver portion 50 is thus connected to the source electrode 70 of the TFT 30 through the wiring layer 37.

As shown in FIG. 8, the interlayer insulating film 61 covers the stepped portion 53. The interlayer insulating film 61 thus compensates for a reentrant-angle shape of the stepped portion 53. In other words, the interlayer insulating film 61 covering the stepped portion 53 forms a reentrant-angle compensating film 54.

In the process of manufacturing an active matrix substrate 42 of this embodiment, the interlayer insulating film 61 is evenly formed on the surface of the protective film 52 so as to cover the TFT 30 and the driver portion 50. The contact holes 62, 64, 72 are then simultaneously formed by photolithography or the like. As a result, the reentrant-angle compensating film 54 is formed as well. Thereafter, an electrically conductive film such as ITO is evenly formed on the surface of the interlayer insulating film 61 (i.e., the reentrant-angle compensating film 54), and is patterned into a prescribed shape to form the pixel electrode 63 and the wiring layer 37 simultaneously. The wiring layer 37 and the pixel electrode 63 are thus formed in the same step from the same material.

The same effects as those of the first embodiment can thus be obtained in the second embodiment. In addition, since the wiring layer 37 and the pixel electrode 63 can be formed in the same step from the same material, manufacturing cost can be reduced without increasing the number of steps.

Other Embodiments

In the above embodiments, the reentrant-angle compensating film 54 is formed from a photosensitive resin and is patterned by photolithography. However, the invention is not limited to this, and the reentrant-angle compensating film 54 may be formed from a non-photosensitive resin and may be patterned by dry etching or the like. The reentrant-angle compensating film 54 may be formed in this way.

INDUSTRIAL APPLICABILITY

As has been described above, the invention is useful for a semiconductor device and a manufacturing method thereof, and a liquid crystal display device having the semiconductor device. The invention is especially suitable for preventing disconnection of a wiring layer in a reentrant-angle portion of a stepped portion.

What is claimed is:

1. A semiconductor device, comprising:
   a substrate;
   a semiconductor device portion formed on the substrate in a protruding state and having a semiconductor element;
   a stepped portion formed along a surface of the semiconductor device portion and a surface of the substrate;
   an insulating reentrant-angle compensating film formed on a surface of the stepped portion, for compensating for at least a part of a reentrant-angle shape of the stepped portion;
   a wiring layer formed along a surface of the reentrant-angle compensating film and connected to the semiconductor device portion, said wiring layer covering the reentrant-angle portion of the stepped portion; and
   wherein the reentrant-angle portion of the stepped portion is located at an elevation below that of a source region and a gate electrode of the semiconductor device,
   a switching element is formed in the substrate so that at least a part of the switching element, including the switching element's gate electrode, is not covered with the reentrant-angle compensating film, and
   the switching element, the wiring layer, the reentrant-angle compensating film, and the semiconductor device portion are covered with an interlayer insulating film.

2. The semiconductor device according to claim 1, wherein the reentrant-angle compensating film has a convex curved surface.

3. The semiconductor device according to claim 1, wherein the reentrant-angle compensating film is formed from a photosensitive resin.

4. The semiconductor device according to claim 1, wherein the semiconductor element of the semiconductor device portion has a semiconductor layer, and an insulating film that covers the semiconductor layer, and the semiconductor layer is attached to the surface of the substrate through at least the insulating film, and a part of the semiconductor layer is separated and removed along a separation layer.

5. The semiconductor device according to claim 1, wherein the reentrant-angle compensating film is formed from an interlayer insulating film that covers the semiconductor device portion.

6. A method for manufacturing a semiconductor device, comprising the steps of:
   forming a semiconductor device portion having a semiconductor element, on a substrate in a protruding state;
   forming a stepped portion at an elevation below a source region of the semiconductor device along a surface of the semiconductor device portion and a surface of the substrate;
   forming an insulating reentrant-angle compensating film on the stepped portion for compensating for at least a part of a reentrant-angle shape of the stepped portion;
   forming, along a surface of the reentrant-angle compensating film, a wiring layer that is connected to the semiconductor device portion, said wiring layer covering the reentrant-angle portion of the stepped portion,
   wherein the reentrant-angle portion of the stepped portion is located at an elevation below that of the source region and a gate electrode of the semiconductor device, and
   forming a switching element in the substrate so that at least a part of the switching element, including the switching element's gate electrode, is not covered with the reentrant-angle compensating film, wherein
   the switching element, the wiring layer, the reentrant-angle compensating film, and the semiconductor device portion are covered with an interlayer insulating film.

7. The method for manufacturing a semiconductor device according to claim 6, wherein
   the semiconductor element of the semiconductor device portion has a semiconductor layer, and an insulating film that covers the semiconductor layer, and
   the semiconductor layer is formed by first forming a separation layer by implanting a separating material into a semiconductor substrate by ion implantation, and then attaching the semiconductor layer to the surface of the substrate through the insulating film, and then separating and removing a part of the semiconductor substrate along the separation layer.

8. A liquid crystal display device comprising: an active matrix substrate having a plurality of pixels arranged in a matrix; a counter substrate facing the active matrix substrate; and a liquid crystal layer formed between the active matrix substrate and the counter substrate, wherein
   the active matrix substrate includes a transparent substrate, a semiconductor device portion formed on the substrate in a protruding state and having a semiconductor element, a stepped portion formed along a surface of the semiconductor device portion and a surface of the substrate, an insulating reentrant-angle compensating film formed on a surface of the stepped portion, for compensating for at least a part of a reentrant-angle shape of the stepped portion, a wiring layer formed along a surface of the reentrant-angle compensating film and connected to the semiconductor device portion, said wiring layer covering the reentrant-angle portion of the stepped portion,
   wherein the reentrant-angle portion of the stepped portion is located at an elevation below that of a source region and a gate electrode of the semiconductor device,
   a switching element is formed in the substrate so that at least a part of the switching element, including the switching element's gate electrode is not covered with the reentrant-angle compensating film, and
   the switching element, the wiring layer, the reentrant-angle compensating film, and the semiconductor device portion are covered with an interlayer insulating film.

9. The liquid crystal display device of claim 8, wherein the semiconductor element of the semiconductor device portion has a semiconductor layer, and an insulating film that covers the semiconductor layer, and wherein the semiconductor layer is attached to the surface of the substrate through the insulating film and a part of the semiconductor layer is separated and removed along a separation layer.

* * * * *